(12) United States Patent
Hayashi et al.

(10) Patent No.: US 6,212,248 B1
(45) Date of Patent: Apr. 3, 2001

(54) SHARED PATH PHASE DETECTOR HAVING PHASE INDICATOR

(75) Inventors: Masayuki Hayashi, Sunnyvale, CA (US); Robert J. Savaglio, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/040,688

(22) Filed: Mar. 18, 1998

(51) Int. Cl.[7] ................................. H03D 3/02; H04L 7/04
(52) U.S. Cl. .......................... 375/375; 375/374; 375/376; 327/157
(58) Field of Search ..................... 375/371, 373, 375/374, 375, 376; 327/147, 156, 157; 331/1 A, 11, 17, 25, 27, 57, DIG. 2

(56) References Cited

U.S. PATENT DOCUMENTS

| | | | |
|---|---|---|---|
| 5,239,561 | * | 8/1993 | Wong et al. .......................... 375/376 |
| 5,469,478 | * | 11/1995 | Lee ........................................ 375/376 |
| 5,495,207 | * | 2/1996 | Novof .................................... 331/57 |
| 5,513,225 | * | 4/1996 | Kelkar et al. ......................... 375/376 |
| 5,525,932 | * | 6/1996 | Kelkar et al. ......................... 331/1 A |
| 5,970,106 | * | 10/1999 | Izumikawa ............................ 375/376 |
| 6,011,822 | * | 1/2000 | Dreyer .................................. 375/376 |

\* cited by examiner

*Primary Examiner*—Young T. Tse
(74) *Attorney, Agent, or Firm*—Mark F. Chadurjian

(57) ABSTRACT

A shared path phase detector and phase indicator circuit provide a phase locked loop circuit for which loading and wiring dependencies are greatly reduced. The phase detector circuit is provided for receiving a reference clock and a second clock. The phase detector circuit provides a separate and unique signal for indicating the magnitude of the difference between the phase of the reference clock and the second clock, regardless of whether the second clock is leading or lagging the first clock. The phase indicator circuit detects whether the second clock is leading or lagging the first clock, and routes the pulses on a first internal signal path to generate either increment or decrement pulses depending on whether the second clock is lagging or leading, respectively. The generation of the increment and decrement pulses is also routed on the first internal signal path, which provides a phase locked loop circuit that does not require matched loading and custom wiring on the internal increment and the decrement paths as required in the prior art.

7 Claims, 6 Drawing Sheets

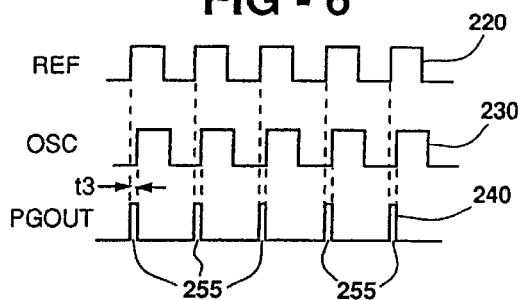
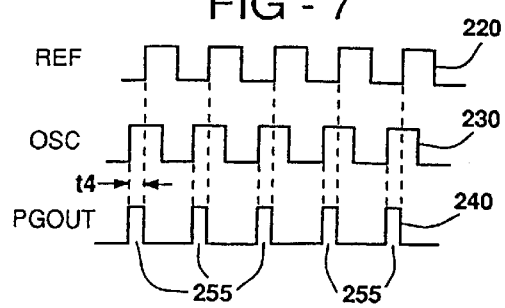
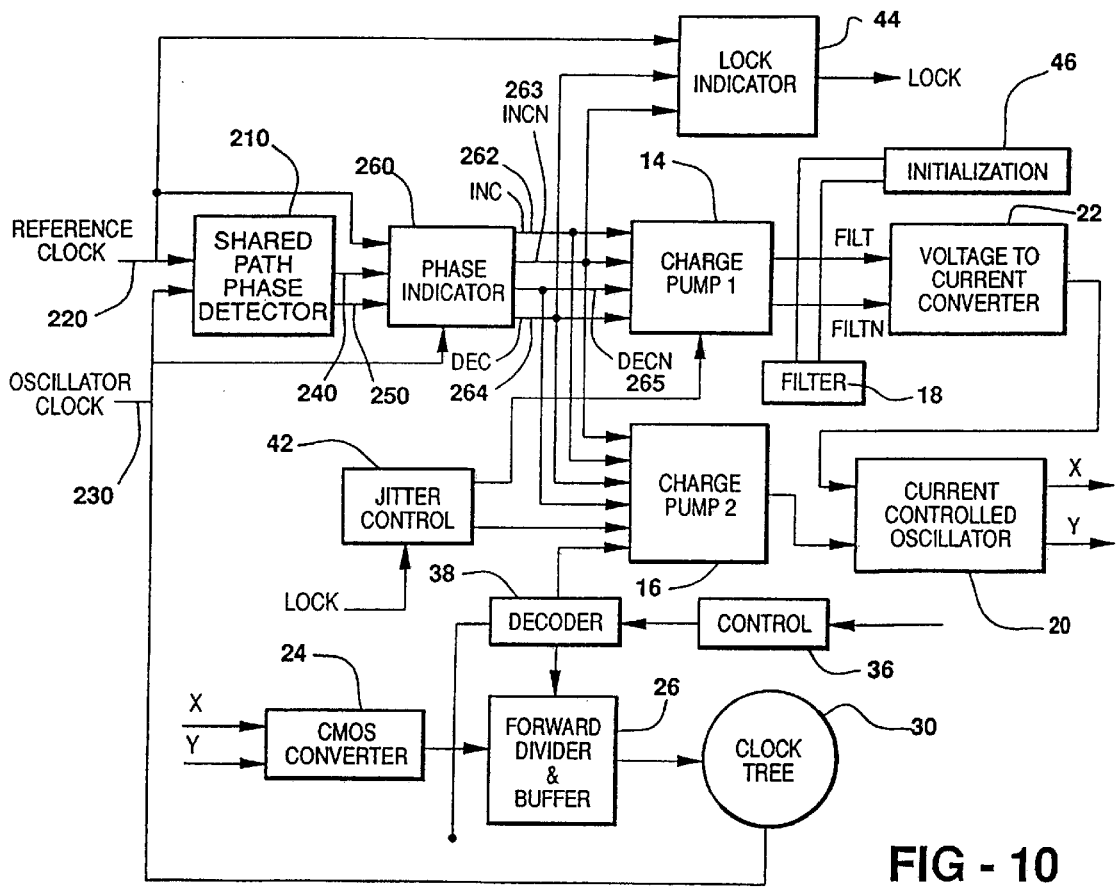

SHARED PATH PHASE DETECTOR HAVING PHASE INDICATOR

FIELD OF THE INVENTION

The present invention relates to the design and manufacture of ASIC (application specific integrated circuit) chips and microprocessor chips. More specifically, the present invention relates to the design of the clocking circuit provided internal to the ASIC chip for synchronizing and controlling the sequential operations of the chip.

BACKGROUND OF THE INVENTION

In the design and manufacture of ASIC (application specific integrated circuit) chips and microprocessor chips, it is conventional practice to provide the chip designer with a library of conventional circuits from which to generate the design. Thus, the circuit designs from which the designer must chose are fixed, and also the rules for interconnecting the circuits by wiring are fixed.

Conventionally, one of the circuits used by a chip designer is a phase locked loop (PLL) circuit. PLLs are used to perform two or three different functions. One principal function is to lock or align the output clock of a circuit with the clock input. A second function is to multiply (i.e., increase) or divide (i.e., decrease) the output frequency of a circuit with respect to the input frequency. A third function is to provide clock recovery, i.e., to attenuate the input jitter associated with input signals and recover the clock from jittery data.

The present invention provides improvement over the prior art, which is better understood by first considering the prior art. Referring to FIG. 1, a block diagram of a phase locked loop (PLL) circuit according to the prior art is shown. The circuit includes a phase/frequency detector 10 which receives a reference clock input and compares the reference clock input frequency with an output clock signal. The phase/frequency detector 10 also receives as input an output strobe pulse of a feedback divider/pulse generator 12 which provides for frequency multiplication in a well-known manner. The strobe pulse is used within the phase/frequency detector 10 to mask the output clock to accomplish frequency division without delay associated with the feedback divider 12 since the phase/frequency detector is comparing a masked feedback signal directly from the clock output and not from the feedback divider/pulse generator 12. Generally, the feedback from the clock tree 30, the feedback divider 12 and the reference clock are used to align the output clock (i.e., clock tree 30). The phase/frequency detector 10 will output increment (INC) and decrement (DEC) pulses to charge pumps 14 and 16.

The phase/frequency detector 10 is a rising edge detector. It compares the rising edge of the clock reference signal and rising edge of PLL output clock. FIG. 2 shows the creation of the INC and DEC outputs of typical prior art phase/frequency detectors. When the output clock phase falls behind or lags the reference clock phase, increment (INC) pulses are generated. The width of this pulse t1 is equal to the timing difference between the rising edges of the reference clock and output clock. When output clock phase is ahead of or leads the reference clock phase decrement (DEC) pulses are generated. The width of this DEC t2 pulse equals the timing difference between the rising edges of the output clock and reference clocks. Due to the speed limitations of the phase/frequency detector circuits, no INC or DEC signals will be generated when reference clock and output clock phases align perfectly within a small delta value of each other. When this delta value is around zero, the detector phase crossing is known as "dead zone," because the detector is functionally "dead" in this region. That is, a "dead zone" is a special case where the phases of the two clock inputs to the phase detector circuit align within a very small delta and cause the two phase detector outputs to go "dead," meaning that there is not a pulse on either output.

Charge pumps 14, 16 will generate current pulses equal in width to INC and DEC pulses. INC will add charge to a differential loop filter 18 comprising a pair of capacitors, and DEC will subtract charge from the filter 18. Charge pump 14 outputs a current signal to filter 18 and either increases or decreases the charge to filter 18, depending upon whether the signal is to increment or decrement the frequency. The increment/decrement signal is also supplied to the second charge pump 16 which converts the increment/decrement signal to a current output which is fed forward to a differential current controlled oscillator 20 which changes its output frequency in response to change in input current. The use of charge pump 16 which supplies current to the oscillator 20 eliminates the need for a resistor coupled to the capacitor of the filter 18. In effect, this performs the differentiation function normally accomplished by such a resistor. Thus, if the output clock is earlier in phase than the reference clock, the phase/frequency detector 10 generates a decrement pulse, and the charge pumps 14, 16 convert this logic signal to current pulses. The pulse from charge pump 14 decreases the voltage across filter 18. Conversely, if the output clock signal is later in phase than the reference clock, the phase frequency detector 10 generates an increment pulse that the charge pump 14 uses to increase the voltage across the filter 18. The filter 18 converts the current from the first charge pump 14 to voltage. In essence, the filter 18 and the charge pump 16 smooth the pulses from pulse generator in order to provide smooth DC voltage to current converter 22.

The output voltage from the filter 18 is supplied as input to the voltage to current converter 22 of conventional design wherein the voltage is converted to current as an output in a well-known manner. The output current from the voltage to current converter 22 is supplied to the differential current controlled oscillator 20 along with the output from the charge pump 16. These two inputs are summed by the current controlled oscillator 20 to provide a differential output, the frequency of which depends upon the value of the current outputs of voltage to current converter 22 and the second charge pump 16. The differential voltage output of the differential current controlled oscillator 20 is supplied to CMOS converter 24 of conventional design which converts the differential voltage output of this oscillator 20 to a single ended output of the desired frequency. The output of the CMOS converter 24 is supplied to a forward frequency divider and buffer 26, of conventional design, which provides a signal having the desired multiple of the input clock frequency as input to a clock distribution tree 30.

The clock distribution tree 30 is a series of clock circuits designed and utilized by the chip designer to perform various clocking functions that are required. In the case of ASIC chips there may be several chips used each of which requires the same clock timing signals. Since processing variables may tend to introduce different delays from chip to chip in the clock distribution tree, the output from the clock distribution tree rather than the output from forward divider and buffer 26 is used as the input to the phase/frequency detector 10 so as to provide the proper phase alignment in all of the chips running from the same clock irrespective of different delays in different chips. The output from the clock distribution tree is also used as input to feedback divider and buffer 12, of conventional design, which functions as a frequency multiplier for the output from the phase/frequency detector 10.

In order to control the frequency multiplication ratio, as well as control the gain of the charge pump 16, a control circuit 36 is provided which provides signals to a decoder 38. The decoder 38 provides signals to charge pump 16 and dividers 26, and 12 to set the frequency multiplication ratios of the circuit in a well known manner. A jitter control circuit 42 is also provided, which will be described in detail presently, and which receives as input the output signal from the phase/frequency detector 10 and controls outputs to the charge pumps 14, 16 to reduce jitter. The lock indicator 44 receives input from the phase/frequency detector 10 and the clock reference signal and outputs a "locked" signal. Finally an initialization circuit 46 is provided which will initialize the circuit in a stable range for proper phase locking by supplying a proper charge to the filter 18 in a well-known manner.

The phase/frequency detector 10 is configured to receive an output signal A from the clock tree 30 and an output signal B from the feedback divider 12 and using these signals to detect the phase difference with respect to the reference clock, and outputs the necessary increment and decrement signals. Both signals (clock tree 30 output A and feedback divider 12 output B) are used since the output frequency is a multiple of the input frequency, and the feedback divider, while outputting a signal matching the frequency of the input signal introduces a delay; hence, the phase of the output of the feedback divider 12 lags the phase of the output signal from the clock tree 30. The phase/frequency detector 10 includes circuitry which masks the output signals from the clock tree so as to have unmasked rising or falling edges of this pulse match the frequency of the rising or falling edges of reference clock input.

Referring to FIG. 3, the two output signals A and B from FIG. 1 are inputted to NAND gate 110, and the gate 110 outputs signal C. The reference clock signal, denoted as REF, is inputted to NAND gate 111. The output of gate 110 is the signal whose phase is to be compared with the phase of the signal from gate 111. The remainder of the circuitry performs this phase comparison in a manner which is generally well known. The output from the gate 110 is supplied as one input to NAND gate 112 and also as one input to NAND gate 114. The output from gate 114 is inputted to NAND gate 116 which outputs a signal to inverters 118 and 120. Gate 116 and inverters 118 and 120 act as a delay circuit 121. The output from inverter 120 is inputted to NAND gate 122 as well as to gate 112, and also to NAND gates 124 and 126. The output from gate 114 is also one input to gate 124 the output of which is one input to gate 114. The output from gate 126 is one input to NAND gate 128 the other input of which is from the output of gate 111.

The output of gate 122 is inputted into inverter 132 which generates an increment (INC) signal and the output of the inverter 132 is inputted to inverter 134 which generates an inverted increment signal referred to as the increment not signal (INCN). Similarly, the output of gate 112 is inputted into inverter 136 which outputs a decrement signal (DEC) and the output of inverter 136 is also inputted into inverter 138 which inverts the decrement signal to produce a signal referred to as the decrement not (DECN) signal. It is the INC and DEC signals that are used to actuate the charge pumps 14 and 16. Since the charge pumps are differential the "NOT" signals are also necessary as is well known for differential circuits. It is the durations of the INC or DEC pulses that control the time the charge pumps 14, 16 output current.

Conventionally, the PLL circuit is an analog circuit, which can be used in digital technology wherein substrate noise is generated. It is necessary in the design of ASIC chips to compensate for delays that might be induced in clock distribution trees. It is also necessary to compensate for any delays that might be induced by dividers in the feedback portion of the circuit. Feedback dividers are used when frequency is being multiplied, which often occurs when the signal being received comes from a relatively low frequency source. The design of the PLL usually requires a custom design or several iterations of manual circuit library placement and wiring in order to obtain a matched loading on an increment path and a decrement path. If some loading difference exists between the two paths, then the increment output pulse width and the decrement output pulse width will not reflect the true input phase differences. In this case, the PLL output frequency will wander away, and this is a source of PLL jitter.

In U.S. Pat. No. 5,546,052, "Phase Locked Loop Circuit with Phase/Frequency Detector which Eliminates Dead Zones" by Austin et al., the prior art type of phase detector (PHD) circuit described above is disclosed having two output paths, increment (INC) and decrement (DEC), where the PLL includes a phase/frequency divider circuit and feedback from a clock distribution tree to generate INC and DEC pulses. A pair of charge pumps receives the INC and DEC pulses and a jitter control circuit is also provided which reduces jitter in the current controlled oscillator output in the locked phase. The PLL circuit eliminates "dead zones" by having equal pulses on both outputs rather than having no pulses.

In U.S. Pat. No. 5,491,439, "Method and Apparatus for Reducing Jitter in a Phase Locked Loop Circuit" by Kelkar et al., the prior art type of phase detector (PHD) circuit described above is disclosed having two output paths, increment (INC) and decrement (DEC), where the PLL includes a phase/frequency divider circuit and feedback from a clock distribution tree to generate INC and DEC pulses. A pair of charge pumps receives the INC and DEC pulses, and a jitter control circuit is also provided which reduces jitter for the oscillator output in the locked phase. Kelkar, in an identical manner to Austin, improves the basic PLL circuit by eliminating "dead zones."

In U.S. Pat. No. 5,329,559, "Phase Detector for Very High Frequency Clock and Data Recovery Circuits" by Wong et al., Wong teaches the prior art type of phase detector (PHD) circuit described above having two output paths, increment (INC) and decrement (DEC). The positive and negative incremental outputs of the PHD circuit are integrated or averaged to eliminate problems associated with any duty cycle distortion and/or jitter in the generated clock. Also, serial data signal input to the phase detector circuit is recovered in addition to the feedback clock. The data is recovered using a second parallel circuit, so that the recovered data is time synchronized. The recovered data signal is derived from signals in the phase detector path, eliminating the need for two distinct circuits for data recovery and clock recovery.

It is an object of this invention to provide a balanced output phase detector circuit that generates a phase locked loop (PLL) output, which is controlled by a phase detector circuit with a first internal signal for indicating the magnitude of the phase difference between the reference and oscillator clocks and a phase indicator signal to direct the usage of the first internal signal.

It is a further object of this invention to provide a balanced output phase detector circuit suitable for use in ASIC and microprocessor chips that is versatile and does not require matched loading on the increment path and the decrement path.

It is a further object of this invention to provide a balance output phase detector circuit with a first internal signal which is independent of which input clock signal leads or lags the other clock, and uses a phase indicator to direct the PLL correction control associated with the first internal output signal.

It is a further object of this invention to provide a balanced output phase detector circuit that generates a first internal signal having a single internal path, without feedback, such that the circuit dependencies are greatly reduced.

It is a further object of the invention to reduce the static jitter by having the increment and decrement paths share the same circuits.

SUMMARY OF THE INVENTION

Accordingly, the present invention provides a phase detector circuit (PHD) comprising a first clock input for receiving a first clock, a second clock input for receiving a second clock, a comparator for comparing the first and second clock input signals to detect the difference in phase between the first and second clocks, and a phase indicator having a first input for receiving a first signal including at least one pulse having a width proportional to the difference in phase and a second input for receiving a second signal for indicating whether the first signal is valid. The phase indicator includes at least one output for indicating whether the second clock is leading or lagging the first clock.

The present invention further provides an integrated circuit comprising a phase detector circuit. The phase detector circuit includes a first clock input for receiving a first clock, a second clock input for receiving a second clock, a comparator for comparing the first and second clocks to detect the difference in phase between the first and second clocks, and a phase indicator having a first input for receiving a first signal including at least one pulse having a width proportional to the difference in phase and a second input for receiving a second signal for indicating whether the first signal is valid. The phase indicator includes at least one output for indicating whether the second clock is leading or lagging the first clock.

The present invention further provides a phase locked loop (PLL) circuit for receiving increment and decrement pulses for controlling phase alignment of a first and second clock comprising a phase detector circuit (PHD). The PHD includes a first clock input for receiving a first clock, a second clock input for receiving a second clock, a comparator for comparing the first and second clocks to detect the difference in phase between the first and second clocks, and a phase indicator having a first input for receiving a first signal including at least one pulse having a width proportional to the difference in phase and a second input for receiving a second signal for indicating whether the first signal is valid. The phase indicator includes at least one output for indicating whether the second clock is leading or lagging the first clock.

The advantages of this invention will become apparent from the following detailed description of the presently preferred embodiment of the invention, taken in conjunction with the accompanying drawings.

BRIEF DESCRIPTION OF THE DRAWINGS

FIG. 6 is a timing diagram for the output signal of a shared path phase detector circuit according to the present invention showing that the width of the output signal is proportional to the phase difference by which the reference clock leads the oscillator clock.

FIG. 7 is a timing diagram for the output signal of a shared path phase detector circuit according to the present invention showing that the width of the output signal is proportional to the phase difference by which the oscillator clock leads the reference clock.

FIG. 10 is a block diagram showing how the phase indicator and shared path phase detector circuits interface to the phase lock loop circuitry according to the present invention.

DETAILED DESCRIPTION OF A PREFERRED EMBODIMENT OF THE INVENTION

In accordance with the invention, a balanced output phase detector circuit is comprised of a phase indicator circuit and a shared path phase detector, and provided for receiving a reference clock and an oscillator clock from an adjustable oscillator. The shared path phase detector (PHD) circuit provides a single internal signal or path, i.e., shared path, for indicating the magnitude of the phase difference between the reference and oscillator clocks. In other words, the increment and decrement paths of the prior art are shared. The output signal is independently derived from the leading or lagging edge relationship of the reference and oscillator clocks. The output signal does not describe which signal leads, but only the magnitude of the phase difference.

Figure 4:
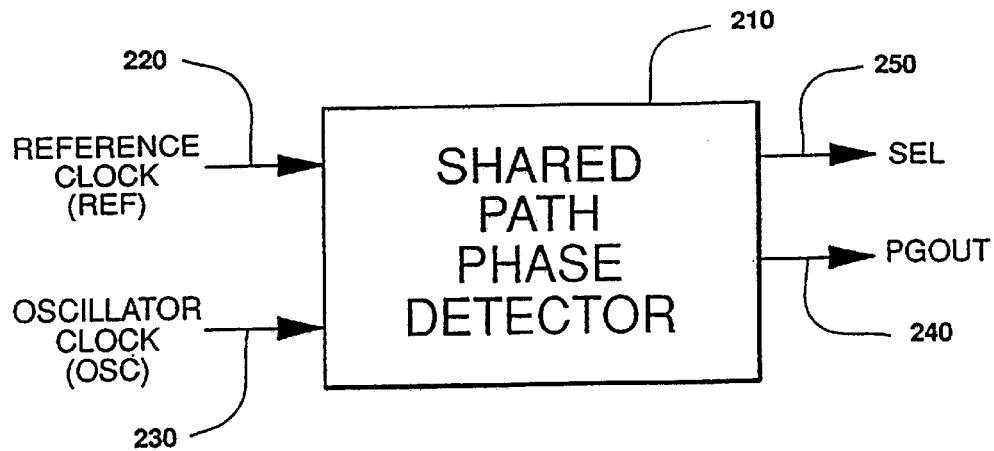
FIG. 4 shows a block diagram of the input and output signals to a shared path phase detector circuit according to the present invention.

Referring to FIG. 4, shared path phase detector 210 is shown to receive two clock inputs, reference clock 220 and oscillator clock 230 of the same frequency. The first output of PHD 210 is the PGOUT 240 signal, which provides a signal for indicating the magnitude difference in phase between the reference 220 and oscillator 230 clocks. The PGOUT signal 240 is independently derived from the leading or lagging edge relationship of the reference 220 and oscillator 230 clocks. The phase detector circuit 210 is further comprised of a second output signal 250, called select (SEL 250), which is used to determine the periods of time during which the first output signal 240 contains valid pulses.

Figure 5:
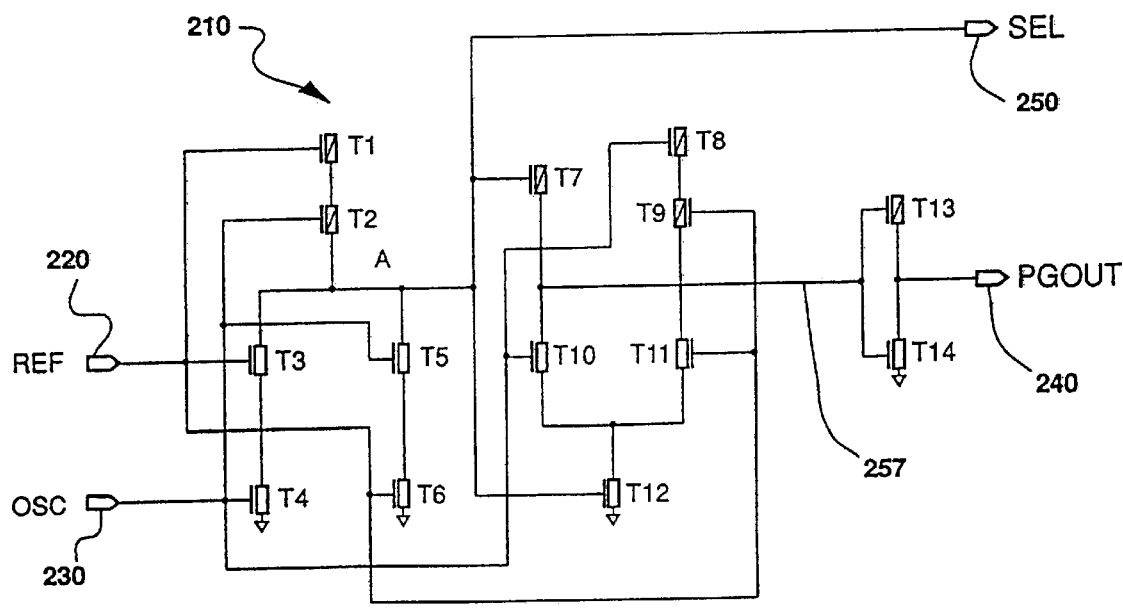
FIG. 5 shows a circuit diagram of a shared path phase detector circuit according to the present invention.

Referring to FIG. 5, a more detailed circuit diagram is shown of shared path PHD 210. PHD 210 is comprised of 14 Field Effect Transistors (FETs) labeled T1 to T14. FETs are well known to those associated with the art of ASIC design. FETs T1–T6 detect the case where REF 220 and OSC 230 are both a logic zero (0) or low, at the same time waiting for the rise of either clock 220, 230. The detection of both clocks equal to logic 0 turns off FETs T1–T6 and sets SEL 250 signal to active high or a logic one (1). SEL 250, being active, turns on T12 and turns off T7. T10 and T11 are also off at this time, but T8 and T9 are on and cause path 257 to go to logic 1 driving PGOUT through inverter T13, T14 to a logic 0. If OSC 230 rises first (leads REF 220), SEL 250 stays at logic 1. OSC 230 goes to logic 1 and turns T10 on. In this case, path 257 goes to logic 0. T13, T14 invert the path 257 signal, so that PGOUT 240 goes to logic 1. In the other case, if the REF 220 clock rises first (leads the OSC 230), SEL 250 stays at logic 1. REF 220 goes to logic 1, turning T11 on. In this case, path 257 goes to logic 0. T13, T14 invert the path 257 signal, so that PGOUT 240 goes to logic 1. When both clocks 220, 230 are logic 1s or high, SEL 250 goes to logic 0 and stays at 0 until one of the clocks returns to logic 0, as controlled by FETs T1–T6. SEL 250, being logic 0, turns T7 on, thus completing pulse with transformation, and turns T12 off and holds path 257 to logic 1 (PGOUT to logic 1). Thus, FETs T7–T12 sense the magnitude of the phase difference between clocks 220 and 230, regardless of whether OSC 230 is leading or lagging REF 220. The magnitude of the phase difference is sent over a single path 257 to FETs T13 and T14 to be inverted and driven as the first output signal, PGOUT 240.

Referring to FIG. 6, a timing diagram for the first output signal (PGOUT 240) of the shared path phase detector circuit 210 is shown. FIG. 6 shows the width magnitude of the PGOUT signal 240 is proportional to the phase difference by which the reference clock 220 leads the oscillator clock 230. The rising edge of reference clock (REF 220) is shown to lead the rising edge of oscillator clock (OSC 230) by an amount of time t3. PHD 210 generates the PGOUT 240 signal based on the t3 time difference in the rising edges of REF 220 and OSC 230. The magnitude (pulse width) of pulse 255 generated on the PGOUT 240 signal is proportional to the difference in phase t3 by which reference clock 220 leads OSC clock 230. Thus, the pulse 255 on PGOUT 240 has a pulse width equal to t3 in this case.

Referring to FIG. 7, a timing diagram for the first output signal 240 of the shared path phase detector circuit 210 is shown. FIG. 7 shows the width magnitude of the output signal is proportional to the phase difference by which the oscillator clock 230 leads the reference clock 220. The rising edge of oscillator clock (OSC 230) is shown to lead the rising edge of reference clock (REF 220) by an amount of time t4. PHD 210 generates the PGOUT 240 signal based on the t4 time difference in the rising edges of OSC 230 and REF 220. The magnitude (pulse width) of pulse 255 generated on the PGOUT 240 signal is proportional to the difference in phase t4 by which oscillator clock 230 leads reference clock 220. Thus, the pulse 255 on PGOUT 240 has a pulse width equal to t4 in this case.

Figure 8:
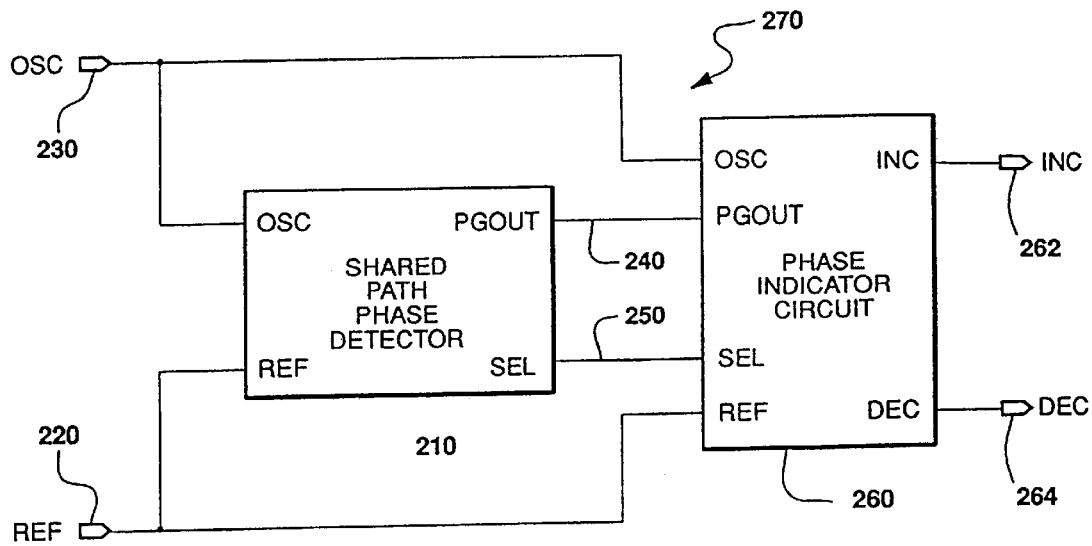
FIG. 8 is a block diagram showing the input signals, internal signals, and output signals of a phase indicator and shared path phase detector circuit according to the present invention.

Referring to FIG. 8, a block diagram is shown of a balanced output phase detector, referred to herein as detector 270. Balanced output phase detector 270 is comprised of shared phase detector 210 (as described hereinabove) and phase indicator circuit 260. The input clocks, OSC 230 and REF 220, are input to both shared path phase detector 210 and phase indicator circuit 260. PHD 210 uses the clock inputs 220,230 to detect the magnitude of the difference in phase of clocks 220,230, and phase indicator 260 uses the clock inputs 220,230 to detect whether clock 230 leads or lags clock 220. The first internal signal (PGOUT 240) and the second internal signal (SEL 250) are driven internally in the balanced output phase detector 270 from shared path phase detector 210 to phase indicator 260. The outputs of the balanced output phase detector 270 are provided as pulses on one of two output signals (INC 262 and DEC 264). The phase indicator 260 provides a selector for routing said pulses being input from the PGOUT 240 signal to either the INC 262 or DEC 264 outputs, and provides increment pulses when the selection means determines that OSC 230 clock is lagging the REF 220 clock, and provides decrement pulses when the selector determines that OSC 230 clock is leading the REF 220 clock.

Figure 9:
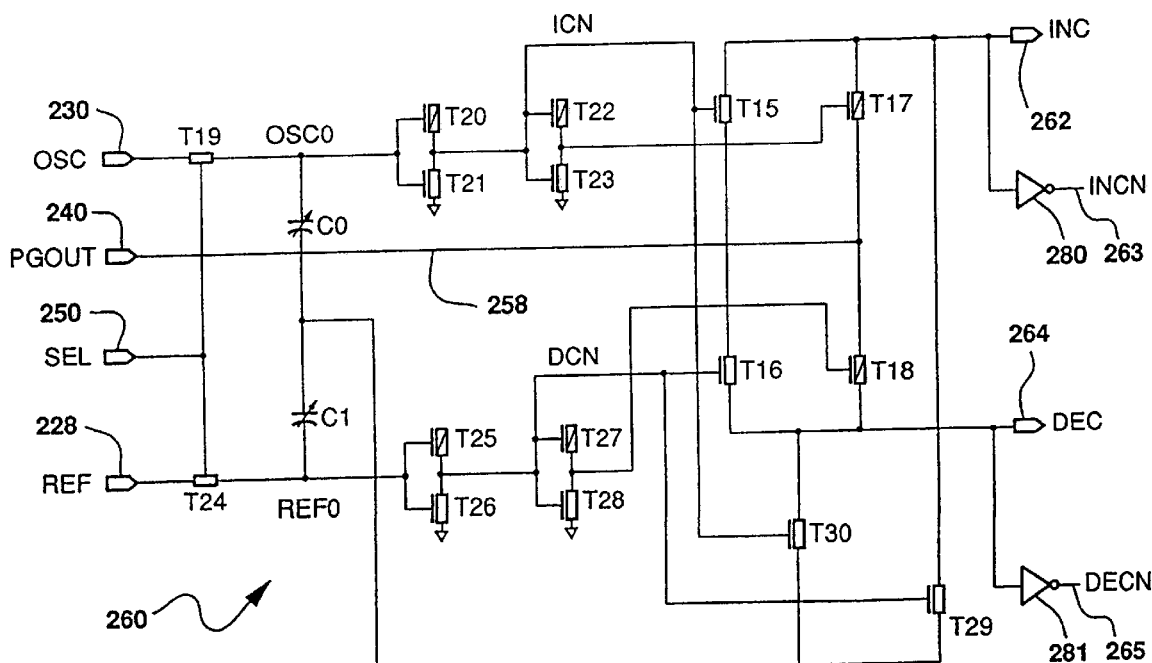
FIG. 9 shows a circuit diagram of a phase indicator circuit according to the present invention.

Referring to FIG. 9, a more detailed circuit diagram is shown of phase indicator circuit 260. Phase indicator 260 is comprised of sixteen Field Effect Transistors (FETs) labeled T15–T30 and inverters 280 and 281. FETs T19 and T24 receive the OSC 230 and REF 228 clocks, respectively, and serve as pass gates to pass the clock signals when SEL 250 input is active (logic 1). FETs T20, T21 implement an inverter, which inverts the OSC0 signal. Then FETs T22 and T23 invert the OSC0 signal again. Likewise, FETs T25–T28 double invert the REF0 signal. If OSC 230 is leading REF 220, FETs T15 and T17 turn off, leaving FETs T16 and T18 turned on to drive PGOUT 240 to the DEC 264 and DECN 265 outputs. FET T30 also turns off in this case to make sure that DEC 264 and DECN 265 outputs are free from being driven to logic 0. Likewise, if OSC 230 is lagging REF 220, FETs T16 and T18 turn off, leaving FETs T15 and T17 turned on to drive PGOUT 240 to the INC 262 output. FET T29 also turns off in this case to make sure that INC 262 and INCN 263 outputs are free from being driven to logic 0. Path 258 provides a single and direct path through phase indicator 260, which is a continuation of single path 257 through the shared path phase detector 210, resulting in a single shared path 257, 258 for the balanced output phase detector 270. The single path 257, 258 allows a common signal 257, 258 throughout the entire circuit 270 to provide pulses 255 to outputs (INC 262 and DEC 264) over the exact same path having the exact same delays and loading.

As seen in FIG. 9, there are two FETs in the path 258 between input signal 240 and each output signal (INC 262 and DEC 264), those FETs being T15 and T17 to gate and drive the INC 262 and INCN 263 outputs and T16 and T18 to gate and drive the DEC 264 and DECN 265 outputs. Single path 257,258 is a feature of the present invention that is particularly applicable for providing a clocking system for an ASIC (application specific integrated circuit) chip. It is simple, requires fewer devices, has less power, provides quick design turn around time, and has less jitter than the prior art. Single path 257, 258 is without feedback loops and load balancing or wire routing restrictions, such that the circuit dependencies are greatly reduced.

Figure 1:
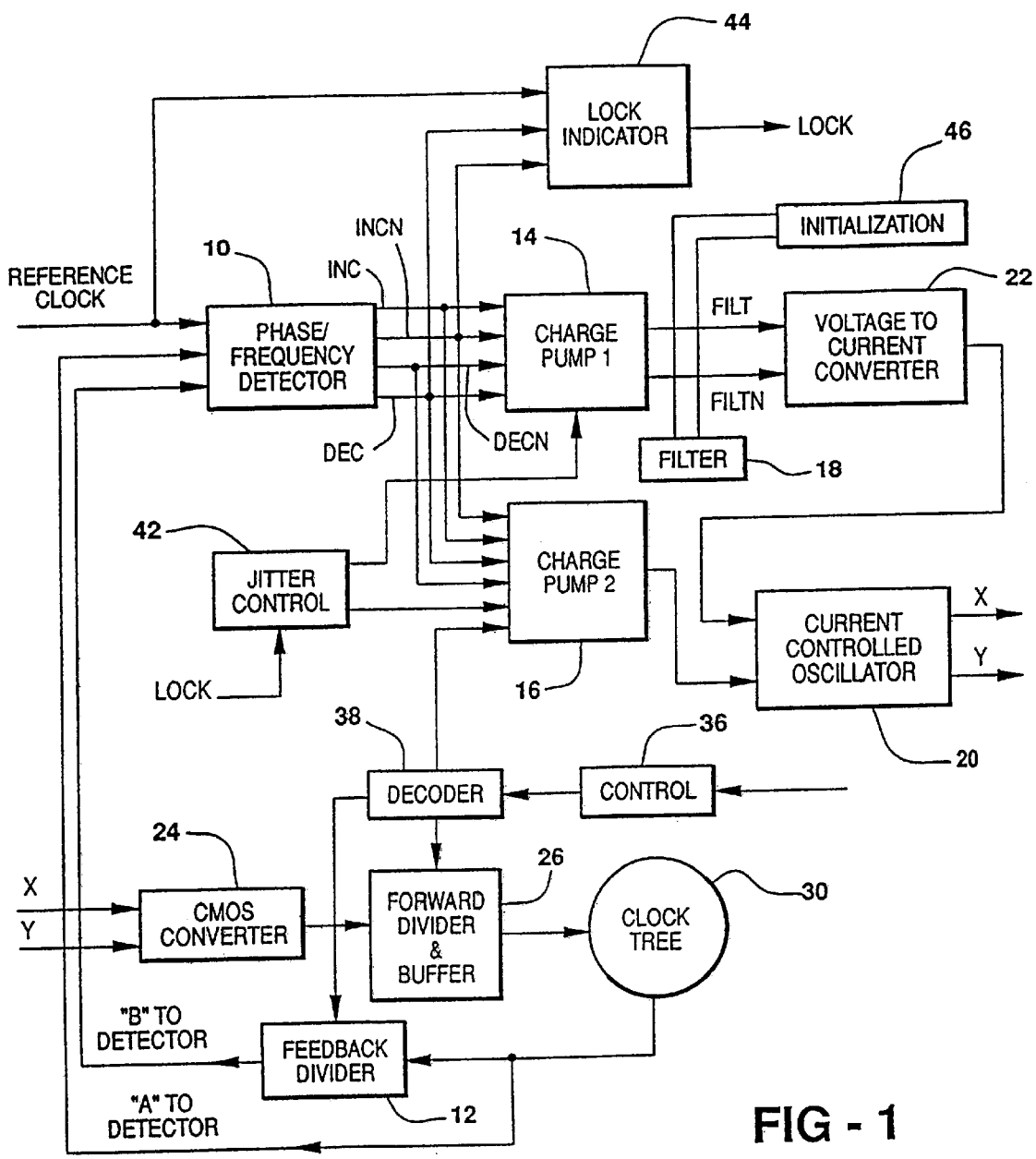
FIG. 1 is a high level block diagram showing a prior art phase locked loop circuit.
Figure 2:
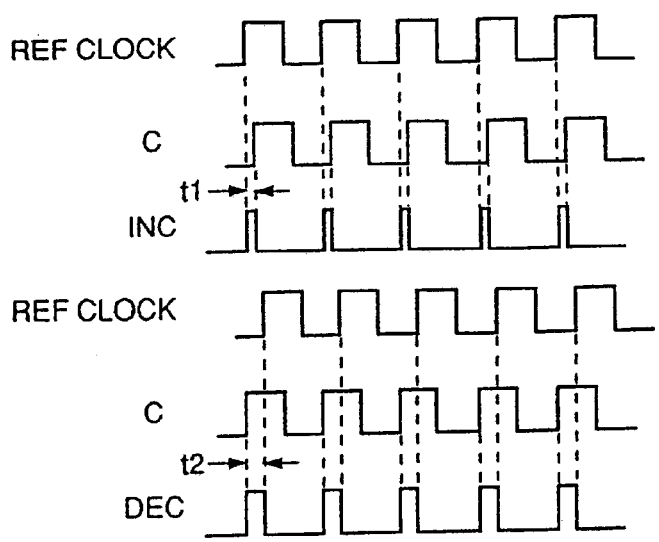
FIG. 2 is a graphical representation of the increment and decrement pulse outputs of the phase detector circuit according to FIG. 1.
Figure 3:
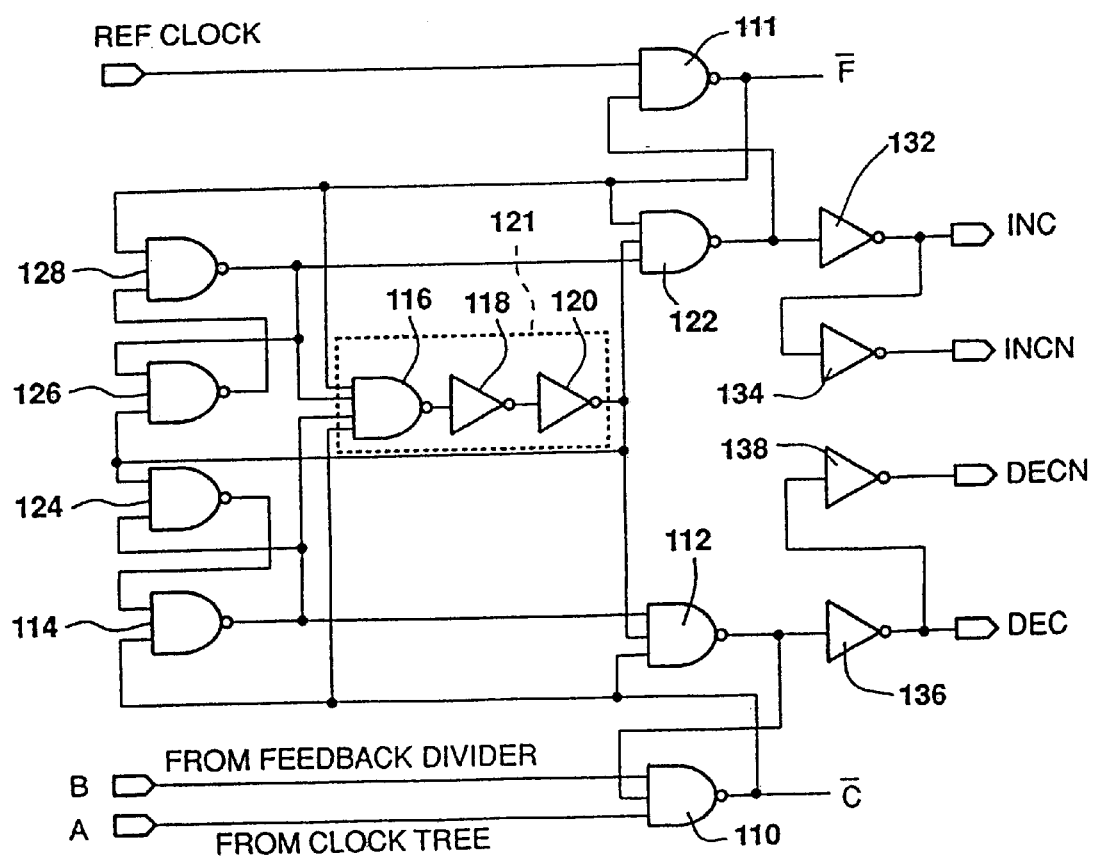
FIG. 3 is a circuit diagram showing the circuitry of a prior art phase detector circuit.

Referring to FIG. 10, a phase locked loop circuit is shown comprising the present invention. The phase locked loop of FIG. 10 is comprised of similar components and functions as the prior art phase locked loop circuit previously shown in FIG. 1. However, the circuit of FIG. 1 is greatly improved by replacing the standard PHD 10 with the balanced output phase detector 270 of the present invention comprising shared path phase detector 210 and phase indicator circuit 260. The present invention drives charge pumps 14,16, lock indicator 44, and oscillator controllers 20, 22. The phase indicator circuit 260 drives INC 262, INCN 263, DEC 264 and DECN 265 output signals to correct the lead or lag of the OSC 230 clock. Phase indicator 260 transmits increment pulses on the INC 262 and INCN 263 outputs for reducing the lag of the OSC 230 clock and decrement pulses on the DEC 264 and DECN 265 outputs for reducing the lead of the OSC 230 clock. The increment or decrement pulses drive charge pumps 14, 16, which in turn drive the OSC controllers 20,22 causing the adjustable oscillator to be corrected. The outputs of the adjustable oscillator drive the clock tree 30 which provides OSC 230 clock, as a feedback signal, to shared path phase detector 210 and phase indicator 260. INC 262, INCN 263 outputs and DEC 264, DECN 265 outputs are matched for improving the prior art design.

Phase indicator circuit 260 is designed so that when increment pulses are provided, the decrement pulses are turned off and when decrement pulses are provided, the increment pulses are turned off. When the OSC 230 and REF 220 input signals arrive at the same time without leading or lagging each other, both the increment and decrement paths are open (turned on) and both outputs have exactly the same small pulse width.

Figure 11:
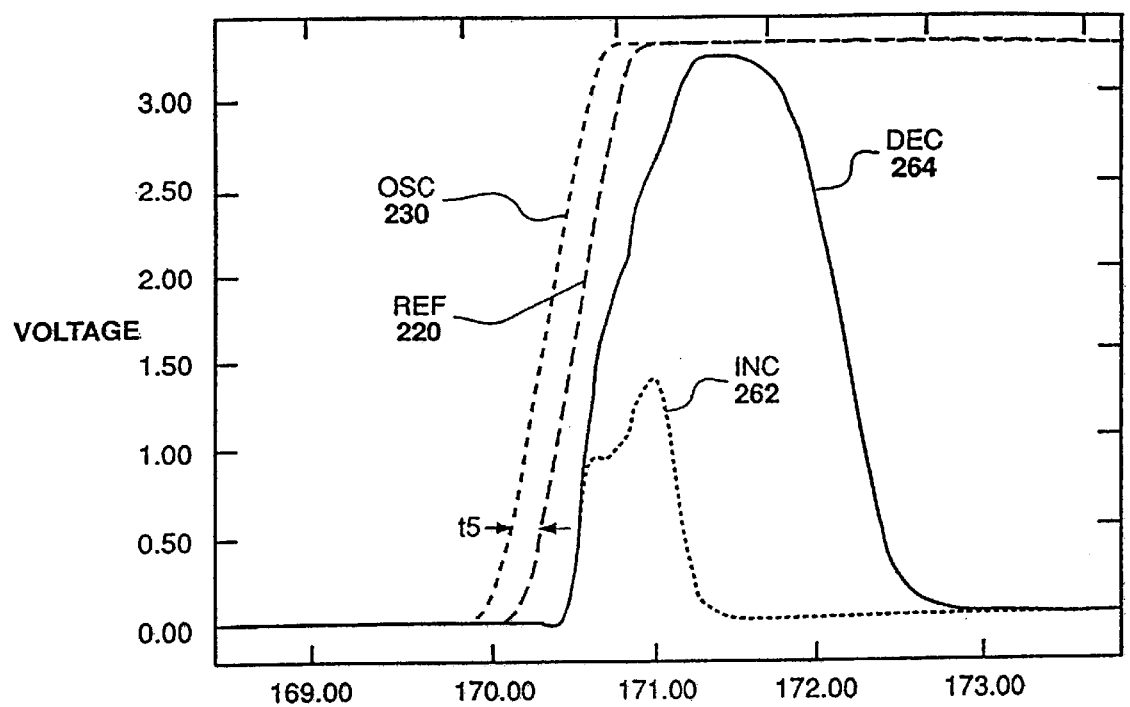
FIG. 11 is a simulated timing diagram illustrating timing of the increment and decrement pulses when the oscillator clock leads the reference clock according to the present invention.
Figure 12:
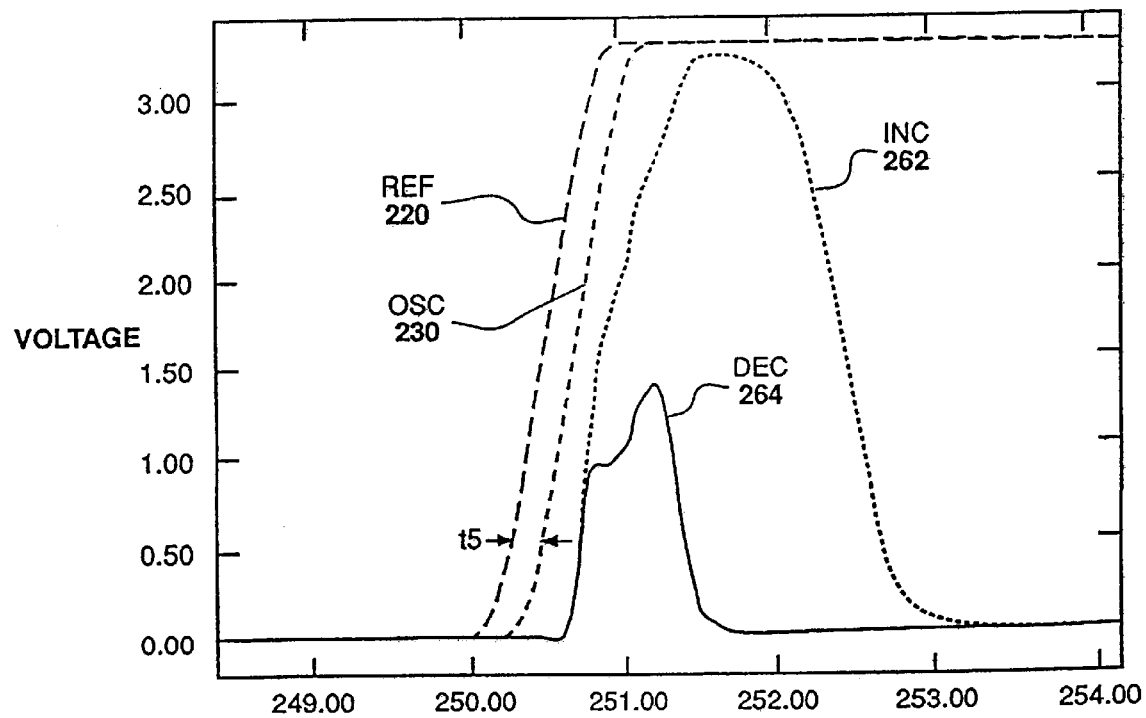
FIG. 12 is a simulated timing diagram illustrating timing of the increment and decrement pulses when the reference clock leads the oscillator lock according to the present invention.

Referring to FIGS. 11 and 12, circuit simulation results are shown for the present invention showing the preciseness of the totally matched INC 262 and DEC 264 outputs. The wire routing and circuit loading parameters were not specifically controlled in the simulation; i.e., the balanced output phase detector circuit 270 was wired and loaded just like any other circuit in the ASIC. FIG. 11 shows that OSC 230 leads REF 220 by t5 and causes balanced output phase detector 270 to generate decrement pulses on DEC 264 and turn off INC 262. FIG. 12 shows that OSC 230 lags REF 220 by the exact same t5 as used in FIG. 11 and causes balanced output phase detector 270 to generate increment pulses on INC 262 and turn off DEC 264. When FIG. 11 overlays FIG. 12, the preciseness of the balancing can be seen as in each case the pulses created have the same delays and the same pulse widths.

It will be appreciated that, although the specific embodiment of the invention has been described herein for purposes of illustration, various modifications may be made without departing from the spirit and scope of the invention. Accordingly, the scope of protection of this invention is limited only by the following claims and their equivalents.

What is claimed is:

1. A phase detector circuit (PHD) comprising:
  a first clock input for receiving a first clock;
  a second clock input for receiving a second clock;
  a comparator for comparing said first and second clocks to detect a difference in phase between said first and second clocks;
  a phase indicator having a first input for receiving a first signal including at least one pulse having a width proportional to said difference in phase and a second input for receiving a second signal for indicating whether said first signal is valid wherein
  said phase indicator includes at least one output for indicating whether said second clock is leading or lagging said first clock;
  wherein said first signal is transmitted through a single shared path to said at least one output.

2. The PHD, as recited in claim 1, wherein said phase indicator includes a first output indicating that said second clock lags said first clock and a second output for indicating that said second clock leads said first clock.

3. The PHD, as recited in claim 2, wherein said phase indicator further includes a selector for routing said first signal to said first output when said second clock is lagging said first clock and for routing said first signal to said second output when said second clock is leading said first clock.

4. The PHD, as recited in claim 3, wherein said first signal includes increment pulses for reducing the lag of said second clock when said first signal is routed to said first output and decrement pulses for reducing the lead of said second clock when said first signal is routed to said second output.

5. The PHD, as recited in claim 3, wherein said selector routes said first signal to said first or second output when said second signal indicates that said first signal is valid.

6. The PHD, as recited in claim 1, wherein said PHD is incorporated in a phase locked loop (PLL) circuit for receiving increment and decrement pulses for controlling phase alignment of said first and said second clock.

7. The PLL, as recited in claim 6, wherein said PLL is an integrated circuit.

* * * * *